(12) United States Patent
Tai et al.

(10) Patent No.: US 6,451,131 B1
(45) Date of Patent: Sep. 17, 2002

(54) TERBIUM-DYSPROSIUM-IRON MAGNETOSTRICTIVE MATERIALS AND DEVICES USING THESE MATERIALS

(75) Inventors: Chiu-Ying Tai, Chelmsford; Chandrashekhar H. Joshi, Bedford, both of MA (US)

(73) Assignee: Energen, Inc., Billerica, MA (US)

( * ) Notice: Subject to any disclaimer, the term of this patent is extended or adjusted under 35 U.S.C. 154(b) by 0 days.

(21) Appl. No.: 09/970,269

(22) Filed: Oct. 2, 2001

Related U.S. Application Data

(60) Provisional application No. 60/301,919, filed on Jun. 29, 2001.

(51) Int. Cl.$^7$ .............................................. H01F 1/053
(52) U.S. Cl. ......................................... 148/301; 420/83
(58) Field of Search ................................ 148/301, 302; 420/83

(56) References Cited

U.S. PATENT DOCUMENTS

| | | | | |
|---|---|---|---|---|
| 3,949,351 A | * | 4/1976 | Clark et al. ................. | 148/301 |
| 4,308,474 A | * | 12/1981 | Savage et al. .............. | 148/301 |
| 5,792,284 A | * | 8/1998 | Cedell et al. ............... | 148/301 |
| 6,017,357 A | * | 6/2000 | Guruswamy et al. ....... | 148/301 |
| 6,273,965 B1 | * | 8/2001 | Pulvirenti et al. .......... | 148/301 |

* cited by examiner

*Primary Examiner*—John Sheehan
(74) *Attorney, Agent, or Firm*—Mirick, O'Connell, DeMallie & Lougee, LLP

(57) ABSTRACT

A Terbium-Dysprosium-Iron magnetostrictive material of the type $Tb_{1-x}Dy_xFe_{2-y}$ wherein x is less than 0.7, and y is less than or equal to 0.1, and devices using these materials.

3 Claims, 4 Drawing Sheets

TERBIUM-DYSPROSIUM-IRON MAGNETOSTRICTIVE MATERIALS AND DEVICES USING THESE MATERIALS

CROSS REFERENCE TO RELATED APPLICATION

This application claims priority of Provisional application serial No. 60/301,919, filed on Jun. 29, 2001.

FIELD OF THE INVENTION

This invention discloses high strength magnetostrictor materials that can be used over a broad range of temperatures from above room temperature to near absolute zero.

BACKGROUND OF THE INVENTION

Although magnetostriction was first discovered by Joule in 1847 in iron, high magnetostriction (almost 1%) was first discovered in the rare-earth elements dysprosium (Dy) and terbium (Tb) at cryogenic temperatures in 1963.

Both terbium and dysprosium derive their magnetism from the partially filled, outermost shell of electrons (4f). The anisotropic distribution of electrons in this shell results in highly anisotropic magnetic and magnetostrictive behaviors. This anisotropy causes the magnetostriction to change suddenly when an activation magnetic field is applied. Below this activation field, there is little magnetostriction and above it the material is saturated at the maximum magnetostriction. Terbium displays a positive anisotropy whereas dysprosium has a negative anisotropy.

To obtain a smooth magnetostriction, the two elements are alloyed together. The alloy $Tb_{0.6}Dy_{0.4}$ exhibits the highest magnetostriction (6300 ppm) but its ordering temperature is about 150K. As an actuator material, it is poor because of its limited mechanical strength.

Since 1995, the $Tb_{1-x}Dy_xZn$ alloy has emerged as the preferred magnetostrictive material for applications at temperatures below ~150K. See U.S. Pat. No. 4,906,879. The magnetostriction of this alloy is comparable to the huge magnetostriction of the rare earth elements Tb and Dy themselves (~0.5% at 77K) and this material is stronger than TbDy. Single crystals are required in almost all cases. For the rare earth elements, orientation is very important since the magnetization remains essentially in the basal plane for all practical magnetic fields. Crystallites oriented in directions out of the plane produce almost no magnetostriction.

A search for high magnetostriction materials at room temperature led to alloying of these rare-earth materials with transition metals such as iron (Fe), culminating in the discovery of high magnetostriction in the Laves phase compound $TbFe_2$. Soon thereafter, dysprosium was added to this compound to reduce the anisotropy. $Tb_{1-x}Dy_xFe_{2-y}$ ($0.7 \leq x \leq 0.8$, $0 \leq y \leq 0.1$) represents the room temperature magnetostrictor commonly referred to as Terfenol-D. See U.S. Pat. No. 4,308,474.

$Tb_{0.3}Dy_{0.7}Fe_{1.95}$ has been described as the optimum composition for room temperature magnetostrictive applications. According to Hathaway and Clark [MRS Bulletin, Vol. XVIII, No. 4, pp. 34–41], this compound shows the highest magnetostriction at room temperature. Measurements of magnetostriction at temperatures below room temperature indicate the magnetostriction increases for decreasing temperature to 250K and then decreases rapidly as the temperature decreases below that range, leading to the conclusion that this material is not a good magnetostrictor at cryogenic temperatures (<250K). See FIG. 1.

SUMMARY OF THE INVENTION

This invention features a Terbium-Dysprosium-Iron magnetostrictive material of the type $Tb_{1-x}Dy_xFe_{2-y}$ wherein x is less than 0.7 and y is less than or equal to 0.1, the material exhibiting magnetostriction of at least about 1000 ppm at all temperatures below 293K. In the preferred embodiment, x is approximately 0.55, and y is approximately 0.1. Also featured are devices using these materials.

BRIEF DESCRIPTION OF THE DRAWINGS

Other objects, features and advantages will occur to those skilled in the art from the following description of preferred embodiments and the accompanying drawings, in which.

DETAILED DESCRIPTION OF THE PREFERRED EMBODIMENTS OF THE INVENTION

Figure 1:
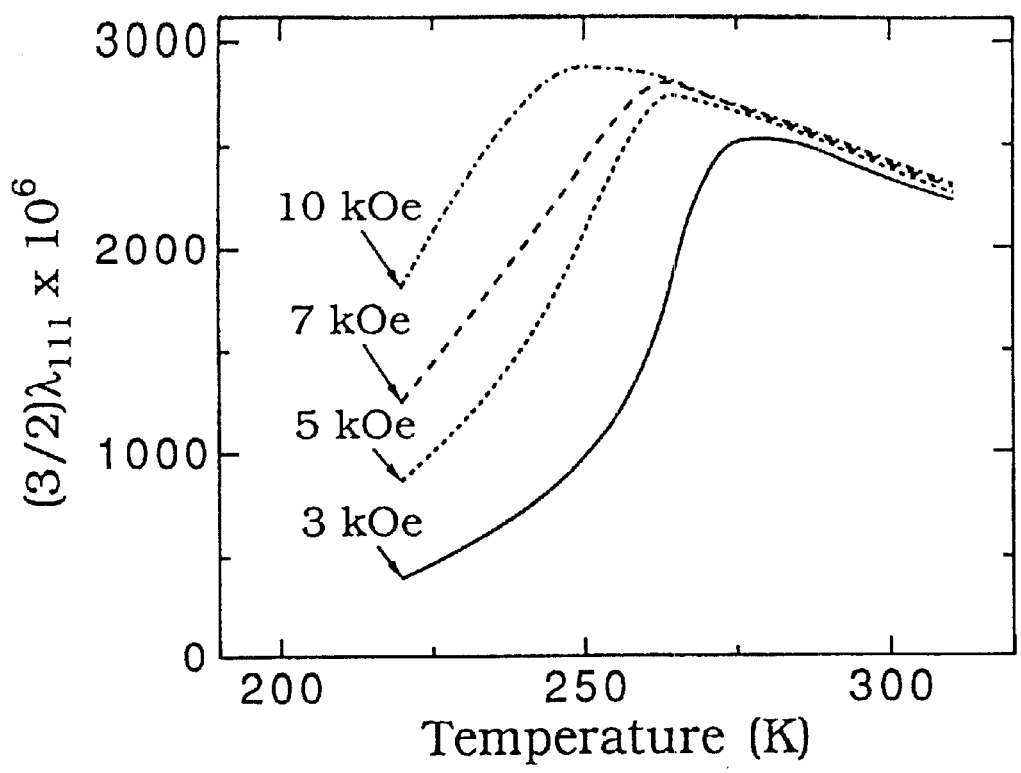
FIG. 1 is a graph of magnetostriction of the prior art material $Tb_{0.3}Dy_{0.7}Fe_{1.95}$ vs. temperature, indicating that magnetostriction decreases rapidly below 250K; [MRS Bulletin, Vol. XVIII, No. 4, p. 37]
Figure 2:
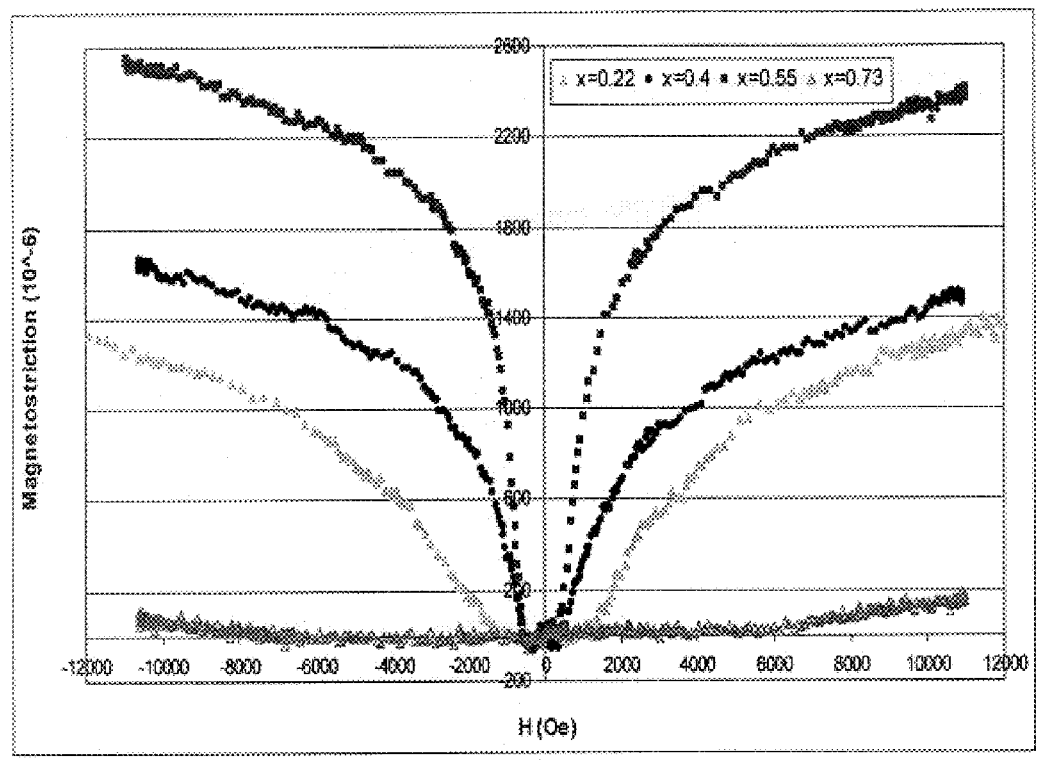
FIG. 2 is a graph of magnetostriction data of the $Tb_{1-x}Dy_xFe_{2-y}$ compounds of the invention, at 77K and with applied compressive stress of 300 psi.
Figure 3:
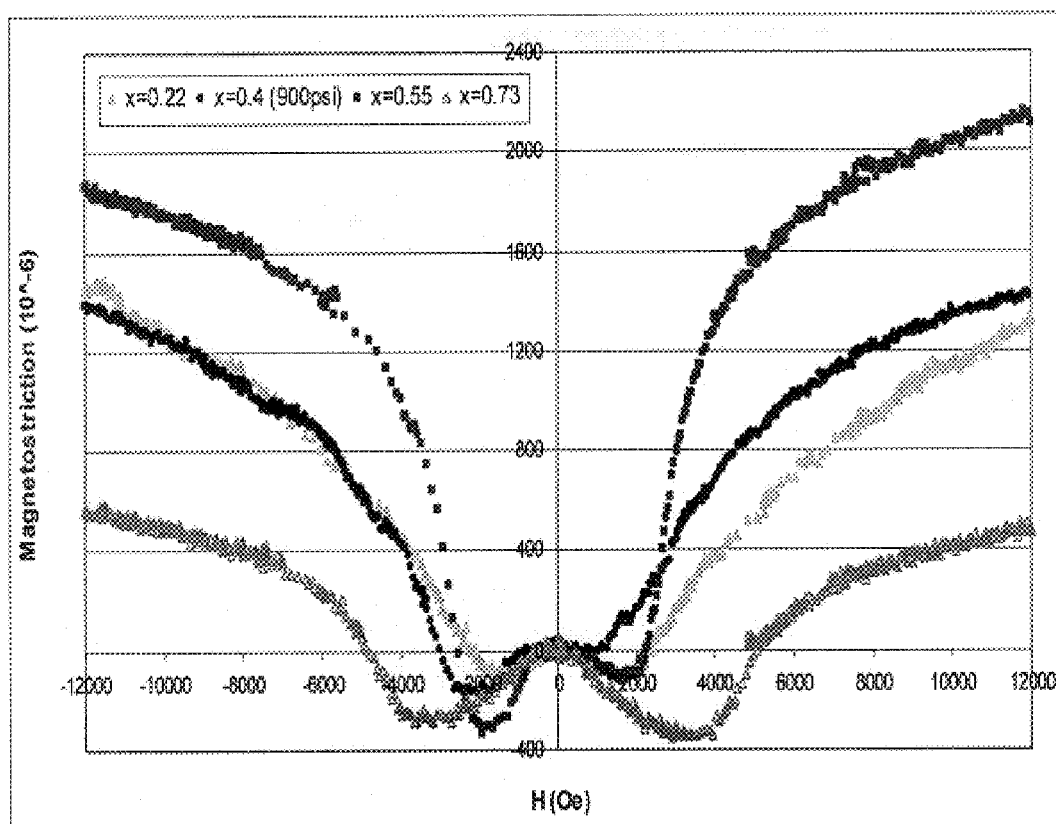
FIG. 3 is a graph of magnetostriction data of the $Tb_{1-x}Dy_xFe_{2-y}$ compounds of the invention at 4.2K and with applied compressive stress of 1300 psi (900 psi for the x=0.4 example)
Figure 4:
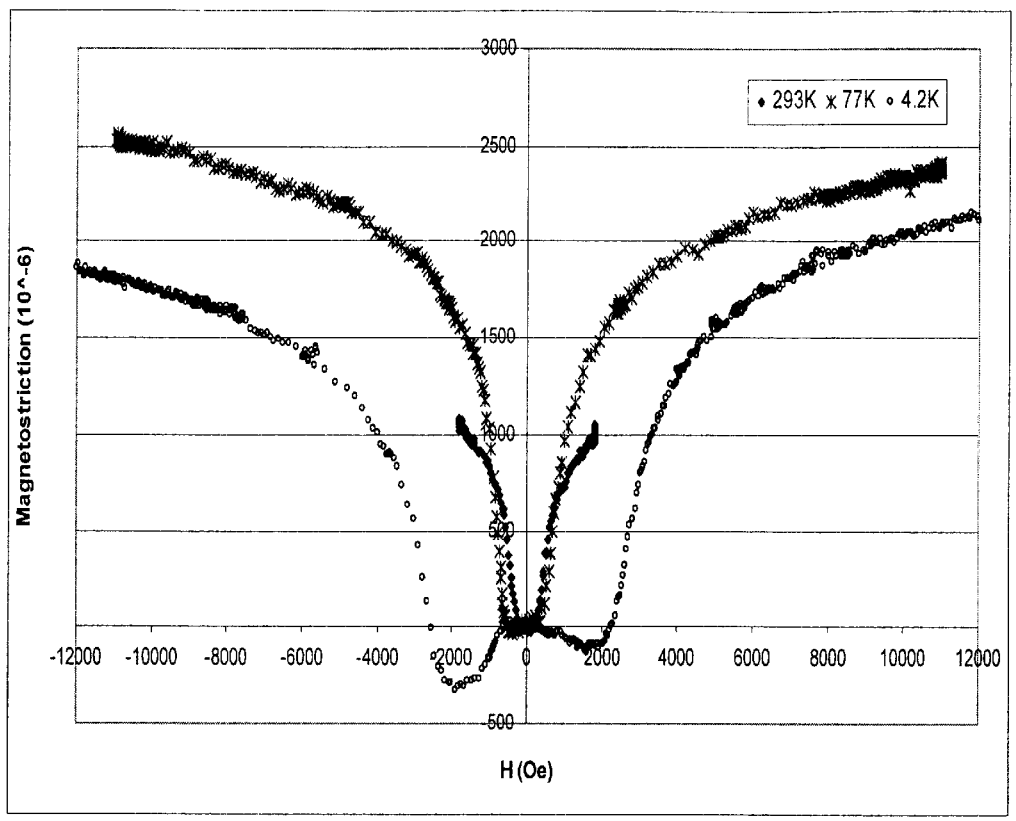
FIG. 4 is a graph of magnetostriction data of the $Tb_{0.45}Dy_{0.55}Fe_{1.9}$ compound of the invention at 293K, 77K, and 4.2K and with applied stress of 1300 psi.

It has been discovered that $Tb_{1-x}Dy_xFe_{2-y}$ compounds with different compositions (x from at least about 0.22 to less than about 0.7) have relatively large magnetostriction at cryogenic temperatures below 250K (e.g., 77K and 4.2K). See FIGS. 2 and 3. The compound with an x value of 0.73 represents the prior art Terfenol-D, which exhibits a saturation magnetostriction of less than 200 ppm at 77K and 800 ppm at 4.2K, amounts that are insufficient for useful commercial purposes. The inventive $Tb_{1-x}Dy_xFe_{2-y}$ compound with x=0.55 has the largest magnetostriction compared to either pure iron (less than 50 ppm at 293K) or commercially available magnetostrictive material Terfenol-D (800–200 ppm at 293K) at different applying temperatures (room temperature—293K, and cryogenic temperatures—77K and 4.2K) (FIG. 4).

Although $Tb_{1-x}Dy_xZn$ has a high magnetostriction at cryogenic temperatures [See U.S. Pat. 4,906,879], commercial applications of this material are still limited due to its complex and therefore expensive fabrication process. The basic process consists of alloying the elements together to form an alloy ingot and then growing a single crystal from the ingot. The alloying process requires a sealed crucible since the boiling temperature of Zn ($T_{boil}$=1180K) is lower than the melting temperature of either Tb ($T_{melt}$=1630K) or Dy (1682K). The sealed crucible is needed to prevent the loss of zinc during the alloying process. This additional work becomes a critical factor in the success or failure of the whole process and also increases the cost. With a closer match in the melting temperature of Fe ($T_{melt}$=1809K), Tb, and Dy, the same problem does not exist in the inventive $T_{1-x}Dy_xFe_{2-y}$. By the same Bridgman method, the fabrication process of $Tb_{1-x}Dy_xFe_{2-y}$ is relatively easier and cheaper than that of $Tb_{1-x}Dy_xZn$.

Based on the investigation mentioned above, $Tb_{1-x}Dy_xFe_{2-y}$ with certain compositions (x from 0.22 to 0.7)

does have useful magnetostriction (typically defined as at least about 1000 ppm) at both room temperature and cryogenic temperatures (293K, 77K, and 4.2K), or even extended to higher temperatures that are below the Curie temperatures ($T_c$~697K for $TbFe_2$ and ~635K for $DyFe_2$, all the $Tb_{1-x}Dy_xFe_{2-y}$ compounds are believed to have their $T_c$ within this range). Also, the relative ease of material fabrication increases the potential applications of these compounds in cryogenic applications.

$Tb_{1-x}Dy_xFe_{2-y}$ can be fabricated using techniques similar to those used for making Terfenol-D. Alloying and crystal growth can be accomplished using a liquid phase alloying in an open crucible because all of the constituents are liquid over a common temperature range. Crystal growth can be accomplished by a Bridgman, modified Bridgman, directional solidification, Czchrolski or other crystal growth techniques.

These materials have sufficient magnetostriction such that they can be applied to a range of cryogenic devices, including linear actuators, linear stepper motors, sensors, and so on.

A linear actuator consists of a rod of the magnetostrictive material that can be exposed to an adjustable magnetic field through an electric coil in which the electrical current can be adjusted, or a permanent magnet whose proximity to the rod can be adjusted. The adjustment of the current in the electric coil or the position of the permanent magnet relative to the rod will cause the rod to elongate in relation to the current or proximity of the magnet. The length change of the magnetostrictive rod inside the linear actuator makes this device an excellent linear motion controller. These actuators can also be used to build active vibration control devices and active positioners.

The same property can also be used to build sensors which sense changes of a magnetic field or stress, by detecting the geometry change of magnetostrictive materials.

The stepper motor uses three magnetostrictive actuators that enable it to move forward or backward in a stepwise motion. This motor can provide a stroke of several millimeters that is limited only by the length available for the translating rod.

Other embodiments of the invention will occur to those skilled in the art from the preceding description and the accompanying claims.

What is claimed is:

1. A Terbium-Dysprosium-Iron magnetostrictive material of the formula $Tb_{1-x}Dy_xFe_{2-y}$ wherein x is approximately 0.55 and y is approximately 0.1, and wherein at temperatures from below 250K to 293K the material exhibits a magnetostriction of at least about 1000 ppm.

2. Devices comprising the material of claim 1.

3. The material of claim 1, wherein the material exhibits a saturation magnetostriction of at least 2000 ppm at 4.2K and 77K.

* * * * *